United States Patent
Willmeroth et al.

(10) Patent No.: US 7,973,362 B2
(45) Date of Patent: Jul. 5, 2011

(54) SEMICONDUCTOR COMPONENT AND METHOD FOR PRODUCING IT

(75) Inventors: Armin Willmeroth, Augsburg (DE); Michael Rueb, Faak am See (AT); Carolin Tolksdorf, Steinhoering (DE); Markus Schmitt, Neubiberg (DE)

(73) Assignee: Infineon Technologies Austria AG, Villach (AT)

( * ) Notice: Subject to any disclaimer, the term of this patent is extended or adjusted under 35 U.S.C. 154(b) by 367 days.

(21) Appl. No.: 11/866,662

(22) Filed: Oct. 3, 2007

(65) Prior Publication Data

US 2008/0237701 A1    Oct. 2, 2008

(30) Foreign Application Priority Data

Oct. 5, 2006    (DE) .................... 10 2006 047 489

(51) Int. Cl.
*H01L 29/66* (2006.01)
*H01L 27/088* (2006.01)
(52) U.S. Cl. .... 257/341; 257/329; 257/401; 257/E21.83
(58) Field of Classification Search .......... 257/E29.198, 257/E29.2, E29.222, 487, 429, 452, 409, 257/484, 483, 335, 336, 337, 440, 401, 502, 257/E29.257, E21.38, 328, 329, 402, 341
See application file for complete search history.

(56) References Cited

U.S. PATENT DOCUMENTS

| | | | |
|---|---|---|---|
| 6,326,656 B1 | 12/2001 | Tihanyi | |
| 6,376,890 B1 * | 4/2002 | Tihanyi | .......................... 257/483 |
| 6,630,698 B1 | 10/2003 | Deboy et al. | |
| 6,825,565 B2 | 11/2004 | Onishi et al. | |
| 6,844,592 B2 * | 1/2005 | Yamaguchi et al. | .......... 257/341 |
| 6,870,201 B1 * | 3/2005 | Deboy et al. | .................... 257/170 |
| 6,888,195 B2 * | 5/2005 | Saito et al. | ..................... 257/328 |
| 6,894,329 B2 * | 5/2005 | Deboy et al. | ................... 257/285 |
| 7,002,205 B2 | 2/2006 | Onishi et al. | |
| 7,091,557 B2 * | 8/2006 | Deboy | ........................... 257/339 |
| 2002/0037636 A1 * | 3/2002 | Schulze et al. | ................ 438/545 |
| 2002/0063281 A1 * | 5/2002 | Tihanyl | ......................... 257/328 |
| 2002/0167020 A1 * | 11/2002 | Iwamoto et al. | .............. 257/110 |
| 2002/0179942 A1 * | 12/2002 | Tihanyi | ......................... 257/213 |
| 2003/0011046 A1 * | 1/2003 | Qu | .................................. 257/598 |
| 2004/0124465 A1 * | 7/2004 | Onishi et al. | ................... 257/341 |
| 2006/0202264 A1 * | 9/2006 | Bhalla et al. | ................... 257/330 |

FOREIGN PATENT DOCUMENTS

| | | |
|---|---|---|
| DE | 19950579 | 5/2001 |
| DE | 10051909 | 5/2002 |
| DE | 10061310 | 6/2002 |
| DE | 10100802 | 8/2002 |
| WO | 9953550 | 10/1999 |
| WO | 0038242 | 6/2000 |

\* cited by examiner

*Primary Examiner* — Lynne A Gurley
*Assistant Examiner* — Galina Yushina
(74) *Attorney, Agent, or Firm* — Dicke, Billig & Czaja, PLLC

(57) ABSTRACT

A semiconductor component includes a semiconductor body having an edge with an edge zone of a first conductivity type. Charge compensation regions of a second conductivity type are embedded into the edge zone, with the charge compensation regions extending from a top side of the semiconductor component vertically into the semiconductor body. For the number $N_s$ of charge carriers present in a volume $V_s$ between two charge compensation regions that are adjacent in a direction perpendicular to the edge, and for the number $N_p$ of charge carriers present in a volume $V_p$ between two charge compensation regions that are adjacent in a direction parallel to the edge, $N_p > N_s$ holds true.

10 Claims, 2 Drawing Sheets

US 7,973,362 B2

SEMICONDUCTOR COMPONENT AND METHOD FOR PRODUCING IT

CROSS-REFERENCE TO RELATED APPLICATIONS

This Utility patent application claims benefit of the filing date of German Application No. DE 10 2006 047 489.9, filed Oct. 5, 2006, incorporated herein by reference.

BACKGROUND

In semiconductor components, in particular in power semiconductor components such as power MOSFETs, the on resistance and the breakdown voltage are important parameters. In conventional semiconductor components the two quantities are coupled via the doping level, such that a lower breakdown voltage has to be accepted for a lower on resistance. One possibility of eliminating this coupling is constituted by compensation components, in which are arranged in the, for example, n-conducting drift path p-conducting compensation regions which compensate for charges introduced into the drift zone by using mirror charges in order in this way to enable an increase in the doping at the drift zone and thus to set the on resistance with the voltage remaining constant.

In order to provide a robust component, the avalanche breakdown is shifted from the edge region of the semiconductor component into the active cell region. For this purpose, compensation regions are also arranged in the edge region of the semiconductor component and have a finer raster there than in the active cell region in order to form an edge termination. What is thereby achieved is that the dopant is distributed more homogeneously in the edge and the intensity of transverse fields is therefore reduced. A semiconductor component of this type is known from DE 101 00 802 C1.

What is problematic in this case, however, is that in order to obtain an even lower on resistance, the compensation structures would have to be miniaturized further in order that the doping levels can be raised correspondingly. However, smaller structures in the lithography planes for producing the compensation zones mean a considerable increase in the fluctuation of the degree of compensation obtained with lithography tolerance remaining constant in the structures produced. Such fluctuations, which result in increased rejects during production, are also intensified by the increase in the doping level since the maximum permitted deviation from the ideal degree of compensation is an absolute quantity. Consequently, the requirements made of the relative accuracy increase proportionally to the higher doping level and the lithography tolerance in the edge zone becomes the limiting element.

For these and other reasons, there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
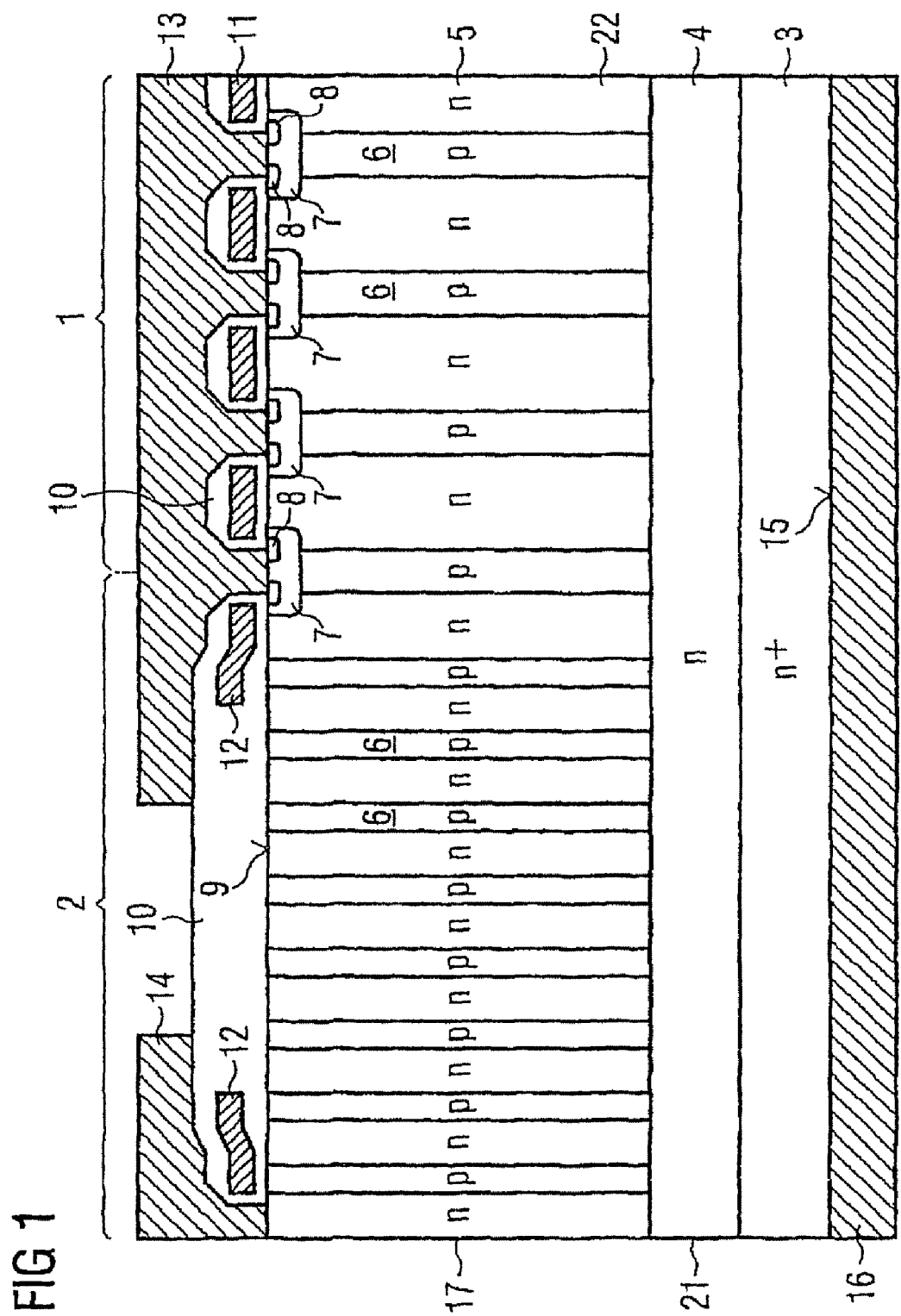
FIG. 1 illustrates a schematic cross section through an excerpt from a semiconductor component in accordance with one exemplary embodiment of the invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

An edge termination for a semiconductor component including a semiconductor body in accordance with one exemplary embodiment of the invention, has an edge with an edge zone of a first conductivity type, has charge compensation regions of a second conductivity type in the edge zone, the charge compensation regions being embedded into the edge zone of the first conductivity type. The charge compensation regions extend from a top side of the semiconductor component vertically into the semiconductor body. In this case, charge compensation regions which extend vertically into the volume are understood here and hereinafter also to mean those which include a group of mutually separate individual compensation regions lying vertically one below another.

For the average number $N_s$ of charge carriers present in a volume $V_s$ between two charge compensation regions that are adjacent in a direction perpendicular to the edge, and for the average number $N_p$ of charge carriers present in a volume $V_p$ between two charge compensation regions that are adjacent in a direction parallel to the edge, $N_p > N_s$ holds true. In this case, charge carriers would be understood to mean the charge carriers in the zero-voltage case.

In the case of a homogeneous doping, therefore, for the average volume $V_s$ between two charge compensation regions that are adjacent in a direction perpendicular to the edge, and for the average volume $V_p$ between two charge compensation regions that are adjacent in a direction parallel to the edge, $V_p > V_s$ also holds true.

The size of the openings in the lithography masks through which the dopings are introduced into the compensation regions is accorded an important significance. In order to avoid the disadvantages in the prior art such as a great manufacturing variation, the openings should be as large as possible. On the other hand, however, for fine distribution of the dopant, a narrowest possible raster should be striven for.

In the off-state case, strong transverse electric fields occur in a direction perpendicular to the edge because the charge carriers in the edge zone, in contrast to the active cell region, are depleted from the zone of the first conductivity type only from one side perpendicularly to the edge, namely from the compensation structure that is adjacent in the direction toward the active region, for which reason a significantly higher potential is required for depletion in the edge region than in the cell region.

In a direction parallel to the edge, the charge carriers are depleted from the zones of the first conductivity type from two sides as in the cell region. Accordingly, the charge carriers are depleted in the edge zone asymmetrically with respect to the directions perpendicular and parallel to the edge.

For better compensation of the charges, this asymmetry should be taken into account in the arrangement of the compensation regions within the edge zone. Since the charge carriers are depleted in the edge zone only from one side perpendicularly to the edge, but from both sides parallel to the edge, the charge compensation regions may be spaced apart further from one another in a direction parallel to the edge than in a direction perpendicular to the edge.

This has the effect that, for each volume unit of edge zone of the first conductivity type to be depleted, a sufficiently large volume unit of a charge compensation region of the second conductivity type is provided and, at the same time, no depletion capability of the compensation regions is wasted. This avoids the need to provide a double potential for depletion in the edge zone, which double potential would lead to the occurrence of strong transverse fields.

In one exemplary embodiment, the charge compensation regions are arranged periodically in the edge zone in such a way that their top sides form grid points of an orthogonal grid on the top side of the semiconductor component, wherein the distances between adjacent grid planes are larger in a direction parallel to the edge than in a direction perpendicular to the edge. In this exemplary embodiment, therefore, the top sides of the charge compensation regions form grid points of a rectangular grid.

The charge compensation regions can have for example the form of pillars having an essentially rectangular cross section; however, they can also be pillars having an essentially round cross section.

In one exemplary embodiment of the invention, the dopant concentration within the charge compensation regions is constant in the vertical direction. As an alternative, however, it can also vary in the vertical direction.

The edge termination can have in addition to the charge compensation regions within the edge zone also further structures such as field rings, field plates or variation of lateral doping zones.

The edge termination can be used particularly well in the case of a vertical semiconductor component, for example. Such a vertical semiconductor component has a front side with a source terminal and a rear side with a drain terminal and, between source and drain, a vertical drift path in which the charge compensation zones are arranged. However, the drain terminal can also be accessible from the front side of the component, where it is arranged at the edge of the semiconductor chip.

A method in accordance with one exemplary embodiment of the invention for producing a semiconductor component having charge compensation regions in its edge zone includes producing a multiplicity of layers of semiconductor material of a first conductivity type for forming a semiconductor body with an edge and an edge zone.

For this purpose, a multiplicity of lithography masks are formed in each case alternately with the deposition of one or more layers of semiconductor material, wherein the masks have openings for introducing charge compensation regions into the layers and the openings have larger average distances to adjacent openings in a direction parallel to the edge than in a direction perpendicular to the edge. With the aid of the masks, charge compensation regions of a second conductivity type are formed, such that the average distances between charge compensation regions are larger in a direction parallel to the edge than in a direction perpendicular to the edge.

In this case, the charge compensation regions can be introduced by ion implantation and subsequent thermal outdiffusion, but the charge compensation regions can also be formed by epitaxial deposition, for example.

The method has the advantage that it is possible to use lithography masks having comparatively large openings for forming the charge compensation regions. As a result, it is possible, if appropriate, to further increase the dopant concentration and to reduce the raster on average without this leading to severe fluctuations in the degree of compensation and hence to increased rejects during production. As a result, it is possible to produce a semiconductor component having optimized compensation properties in which it is nevertheless possible to shift the avalanche breakdown from the edge zone into the active cell region. Identical parts are provided with the same reference symbols in all the figures.

The semiconductor component in accordance with FIG. 1 has an active cell region 1 surrounded by an edge zone 2. A semiconductor body 21 composed of silicon, for example, typically has an $n^+$-conducting substrate 3 and additionally n-conducting layers 4, 5.

n-conducting source zones 8 with p-conducting wells 7 are arranged at the top side 9 of the semiconductor component, the source zones being contact-connected by a source contact 13. On its rear side 15, the semiconductor component has a drain contact 16. A vertical drift path 22 is provided between source zones 8 and drain contact 16, p-conducting, pillar-type charge compensation regions 6 being arranged in the drift path. The semiconductor component can be controlled by gate electrodes 11 arranged in an insulation layer 10.

In the edge zone 2 as well, charge compensation zones 6 are embedded into the n-conducting layer 5. In order to increase its breakdown voltage, the semiconductor component has an edge termination with a denser raster of charge compensation regions 6 in comparison with the raster of the charge compensation regions 6 in the active cell region 1, the edge termination shifting the avalanche breakdown from the edge zone 2 into the active cell region 1. Further structures such as field plates 12 and/or guard rings 14 can additionally be provided in the edge zone 2 in order to increase the breakdown voltage.

It can be discerned in the cross-sectional view in accordance with FIG. 1 that the edge termination includes a dense raster of charge compensation regions 6. The fact that the raster is different for the directions parallel and perpendicular to the edge 17 is illustrated in FIGS. 2 to 4.

Figure 2:
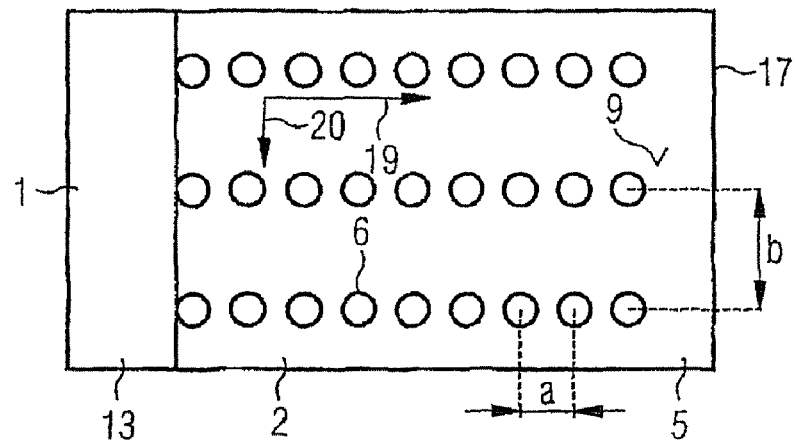
FIG. 2 illustrates a schematic plan view of a first embodiment of the semiconductor component in accordance with FIG. 1.

FIG. 2 illustrates a first embodiment of the edge termination according to aspects of the invention. In the edge zone 2, p-conducting charge compensation regions 6 are embedded into the n-conducting layer 5, the charge compensation regions having the form of pillars having an essentially round cross section in this embodiment. In the direction 19 perpendicular to the edge 17, the charge compensation zones 6 are at a distance a from their nearest neighbors, while in the direction 20 parallel to the edge they are at a distance b from their nearest neighbors. In this case, b>a holds true.

Figure 3:
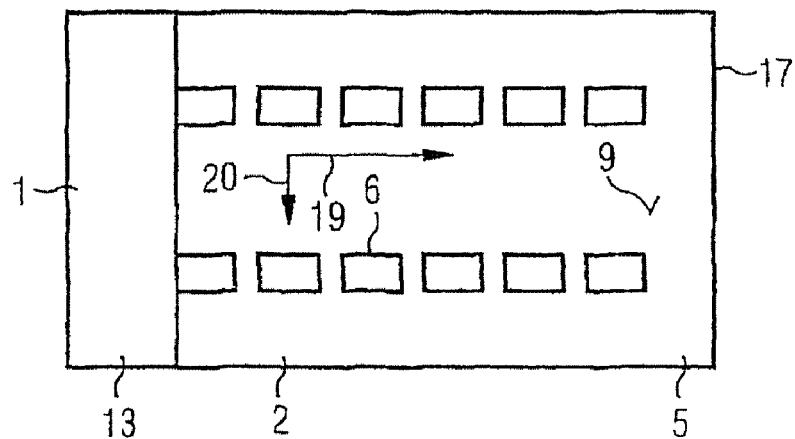
FIG. 3 illustrates a schematic plan view of a second embodiment of the semiconductor component in accordance with FIG. 1.

A similar arrangement is illustrated in FIG. 3. In this exemplary embodiment, the charge compensation regions 6 have the form of pillars having an essentially rectangular cross section.

Figure 4:
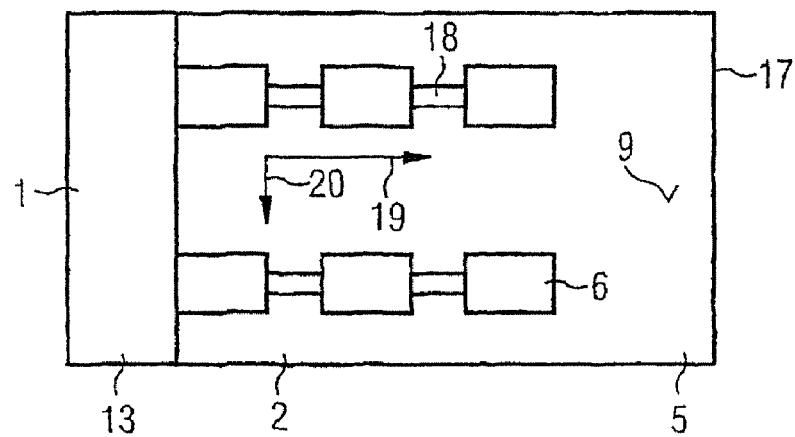
FIG. 4 illustrates a schematic plan view of a third embodiment of the semiconductor component in accordance with FIG. 1.

FIG. 4 illustrates a modification of the embodiment in accordance with FIG. 3, in which weakly p-conducting bridges 18 are arranged between the individual charge compensation pillars 6. As long as the bridges 18 are not fully depleted, the zone of the n-conducting layer 5 between the charge compensation regions 6 connected by the bridges 18 is depleted not just from one side, but from both sides in the direction 19. In this case, the bridges 18 can also be formed as variation of lateral doping zones, that is to say that their doping can have a gradient along the direction 19 to the edge 17.

If the bridges 18 are fully depleted, the n-conducting layer 5 is again depleted only from one side, for which reason here as well the raster of the charge compensation zones was chosen to be narrower in the direction 19 perpendicular to the edge 17 than in the direction 20 parallel to the edge 17.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor component comprising:
   a semiconductor body having an edge with an edge zone of a first conductivity type;
   charge compensation regions of a second conductivity type embedded into the edge zone, the charge compensation regions extending from a top side of the semiconductor component vertically into the semiconductor body;
   wherein for the number $N_s$ of charge carriers present in a volume $V_s$ between two charge compensation regions that are adjacent in a direction perpendicular to the edge of the semiconductor body, and for the number $N_p$ of charge carriers present in a volume $V_p$ between two charge compensation regions that are adjacent in a direction parallel to the edge, $N_p > N_s$ holds true;
   where $V_s$ and $V_p$ have the same cross-section areas but different lengths, and where the length of volume $V_s$ is equal to the distance between two adjacent vertical planes of compensation regions and the length of volume $V_p$ is equal to the distance between two adjacent horizontal planes of charge compensation regions;
   wherein the charge compensation regions are spaced apart further from one another in a direction parallel to the edge of the semiconductor body than in a direction perpendicular to the edge of the semiconductor body, in plan view; and
   wherein the charge compensation regions are arranged in the edge zone in such a way that their top sides form grid points of an orthogonal grid on the top side of the semiconductor component, wherein the distances between adjacent grid planes are larger in the direction parallel to the edge of the semiconductor body than in the direction perpendicular to the edge of the semiconductor body.

2. The semiconductor component as claimed in claim 1, wherein the charge compensation regions are pillars having an essentially rectangular cross section.

3. The semiconductor component as claimed in claim 1, wherein the charge compensation regions are pillars having an essentially round cross section.

4. The semiconductor component as claimed in claim 1, wherein the dopant concentration within each of the charge compensation regions is constant in the vertical direction.

5. The semiconductor component as claimed in claim 1, wherein the dopant concentration within each of the charge compensation regions varies in the vertical direction.

6. The semiconductor component as claimed in claim 1, further comprising a guard ring arranged within the edge zone.

7. The semiconductor component as claimed in claim 1, further comprising a field plate arranged within the edge zone.

8. The semiconductor component as claimed in claim 1, wherein variations of lateral doping zones are arranged within the edge zone.

9. The semiconductor component as claimed in claim 1, wherein the semiconductor component is a vertical semiconductor component.

10. The semiconductor component as claimed in claim 1, further comprising an active cell region adjacent the edge zone.

* * * * *